US010409595B2

United States Patent
Shabbir et al.

(10) Patent No.: US 10,409,595 B2
(45) Date of Patent: Sep. 10, 2019

(54) SYSTEMS AND METHODS FOR DYNAMICALLY-ENABLED POLLING OF A MEASURED PROCESS VALUE IN A CLOSED-LOOP CONTROL SYSTEM

(71) Applicant: Dell Products L.P., Round Rock, TX (US)

(72) Inventors: Hasnain Shabbir, Round Rock, TX (US); Dominick A. Lovicott, Jarrell, TX (US)

(73) Assignee: Dell Products L.P., Round Rock, TX (US)

(*) Notice: Subject to any disclaimer, the term of this patent is extended or adjusted under 35 U.S.C. 154(b) by 148 days.

(21) Appl. No.: 15/607,146

(22) Filed: May 26, 2017

(65) Prior Publication Data

US 2018/0341485 A1    Nov. 29, 2018

(51) Int. Cl.
| | | |
|---|---|---|
| G06F 1/26 | (2006.01) | |
| G06F 1/32 | (2019.01) | |
| G06F 9/30 | (2018.01) | |
| G06F 1/20 | (2006.01) | |
| H05K 7/20 | (2006.01) | |

(52) U.S. Cl.
CPC .......... *G06F 9/30021* (2013.01); *G06F 1/203* (2013.01); *G06F 1/206* (2013.01); *H05K 7/20836* (2013.01)

(58) Field of Classification Search
CPC .................................................. G06F 9/30021
See application file for complete search history.

(56) References Cited

U.S. PATENT DOCUMENTS

| | | | | |
|---|---|---|---|---|
| 6,078,158 | A * | 6/2000 | Heeren | G11B 19/20 |
| | | | | 318/254.2 |
| 7,246,005 | B2 * | 7/2007 | Johnson | F01N 3/025 |
| | | | | 123/436 |
| 9,892,359 | B2 * | 2/2018 | Jesme | G01J 5/02 |
| 10,146,190 | B2 * | 12/2018 | Lovicott | G05D 23/1919 |
| 2001/0021217 | A1 * | 9/2001 | Gunther | G01K 7/015 |
| | | | | 374/178 |
| 2004/0258113 | A1 * | 12/2004 | Liu | H01S 5/0021 |
| | | | | 372/38.01 |
| 2009/0260776 | A1 * | 10/2009 | Calamaro | E04B 1/74 |
| | | | | 165/45 |
| 2017/0277207 | A1 * | 9/2017 | Peterson | G05D 19/02 |
| 2017/0315568 | A1 * | 11/2017 | Lovicott | G05D 23/1919 |

\* cited by examiner

*Primary Examiner* — Mohammed H Rehman
(74) *Attorney, Agent, or Firm* — Jackson Walker L.L.P.

(57) ABSTRACT

In accordance with embodiments of the present disclosure, a system may include a controller configured to control a process value using closed-loop control, wherein: (i) when using closed-loop control, the controller controls the process value based on a measured process value indicative of the process value communicated from a sensor and by generating a driving signal that is a maximum of a first driving signal which is the function of the measured process value and a second driving signal; and (ii) the controller is configured to disable polling by the controller of the sensor for the measured process value when the driving signal is greater than a threshold open-loop driving signal sufficient to maintain the process value within a desired range of the process value in the absence of closed-loop control.

21 Claims, 2 Drawing Sheets

SYSTEMS AND METHODS FOR DYNAMICALLY-ENABLED POLLING OF A MEASURED PROCESS VALUE IN A CLOSED-LOOP CONTROL SYSTEM

TECHNICAL FIELD

The present disclosure relates in general to information handling systems, and more particularly to dynamic enablement of polling of a measured process value in a closed-loop system, such as a measured temperature in a closed-loop thermal control system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

Temperature control in an information handling system with air movers often involves use of a closed-loop feedback system that alters air mover speed or throttles component performance in response to a sensed temperature in the information handling system. Such temperature control may also involve open-loop control, wherein air movers may operate a particular worst case open-loop air mover speed in the event of a fault in the closed-loop control system (e.g., failure of temperature sensor).

In closed-loop control, while periodic polling of a temperature sensor associated with a component may be beneficial for optimizing power consumption by air movers, such polling can result in taxing communications channels in the information handling system, thus resulting in decreased processing performance. Accordingly, systems and methods by which temperature polling may be decreased without negative impact to thermal control are desired.

SUMMARY

In accordance with the teachings of the present disclosure, the disadvantages and problems associated with polling of measured processed values, such as a measured temperature, in a closed-loop system may be substantially reduced or eliminated.

In accordance with embodiments of the present disclosure, a system may include a controller configured to control a process value using closed-loop control, wherein: (i) when using closed-loop control, the controller controls the process value based on a measured process value indicative of the process value communicated from a sensor and by generating a driving signal that is a maximum of a first driving signal which is the function of the measured process value and a second driving signal; and (ii) the controller is configured to disable polling by the controller of the sensor for the measured process value when the driving signal is greater than a threshold open-loop driving signal sufficient to maintain the process value within a desired range of the process value in the absence of closed-loop control.

In accordance with these and other embodiments of the present disclosure, a method may include using closed-loop control by controlling a process value based on a measured process value indicative of the process value communicated from a sensor and by generating a driving signal that is a maximum of a first driving signal which is the function of the measured process value and a second driving signal and disabling polling of the sensor for the measured process value when the driving signal is greater than a threshold open-loop driving signal sufficient to maintain the process value within a desired range of the process value in the absence of closed-loop control.

In accordance with these and other embodiments of the present disclosure, a an article of manufacture may include a non-transitory computer-readable medium and computer-executable instructions carried on the computer-readable medium, the instructions readable by a processor, the instructions, when read and executed, for causing the processor to: operate a process using closed-loop control by controlling a process value based on a measured process value indicative of the process value communicated from a sensor and by generating a driving signal that is a maximum of a first driving signal which is the function of the measured process value and a second driving signal and disable polling by the controller of the sensor for the measured process value when the driving signal is greater than a threshold open-loop driving signal sufficient to maintain the process value within a desired range of the process value in the absence of closed-loop control.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
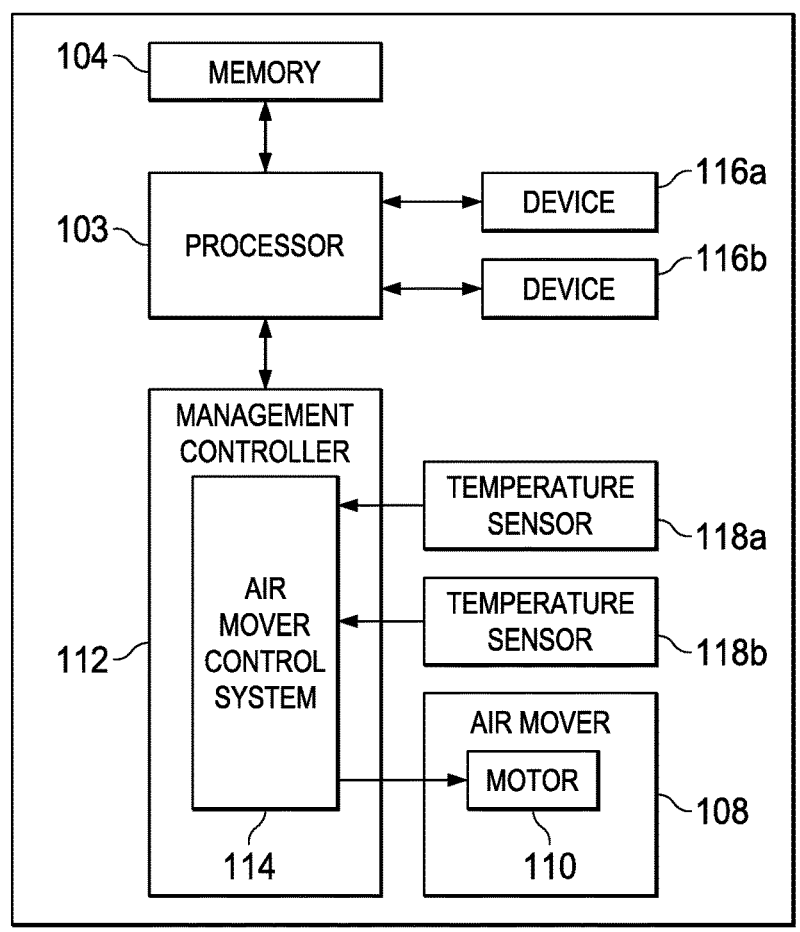
FIG. 1 illustrates a block diagram of an example information handling system, in accordance with the present disclosure.
Figure 2:
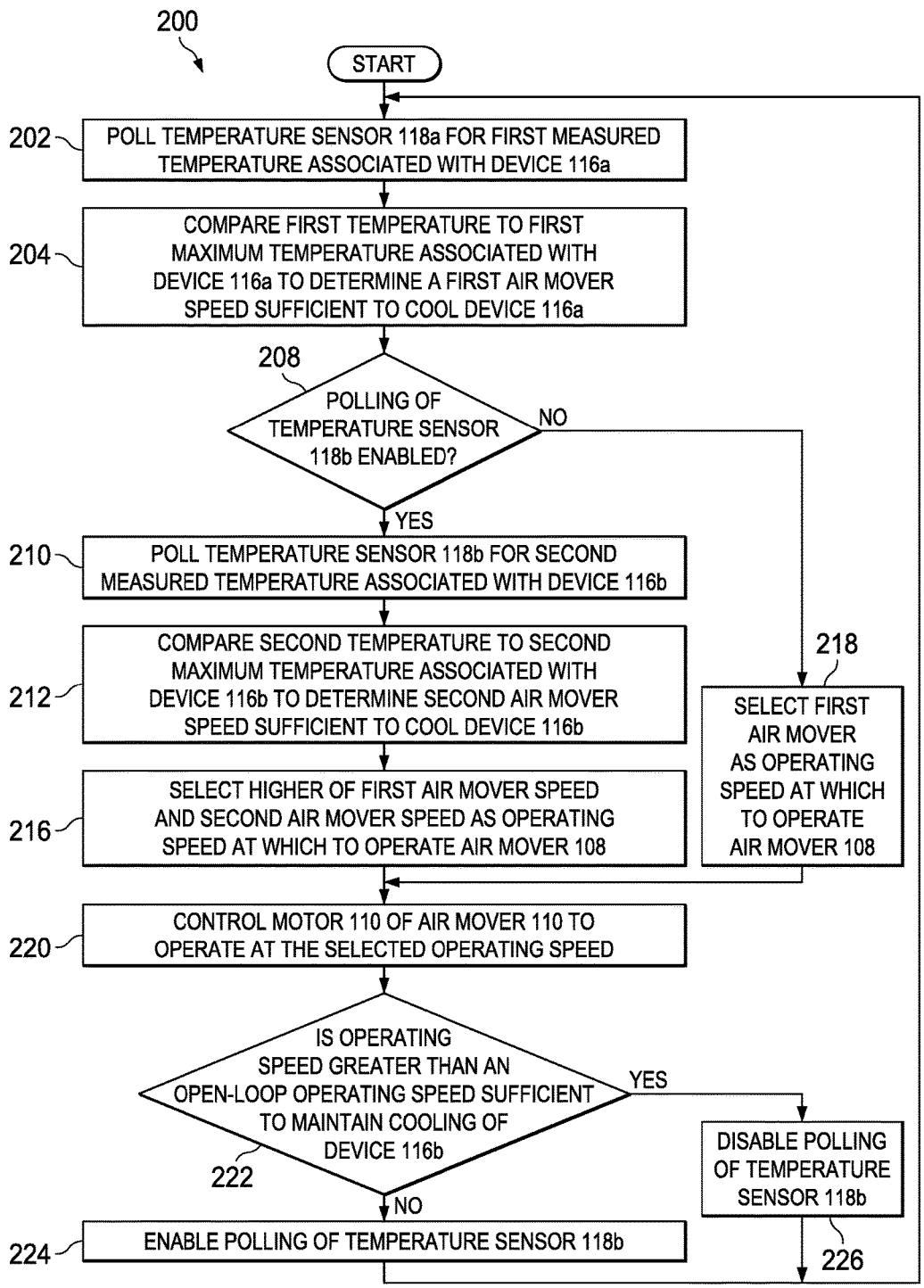
FIG. 2 illustrates a flow chart of an example method for dynamic enablement of polling of a measured temperature in an air mover control system, in accordance with the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a block diagram of an example information handling system 102, in accordance with the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may comprise a processor 103, a memory 104, an air mover 108, a management controller 112, a plurality of devices 116 (e.g., 116a and 116b), and a plurality of temperature sensors 118 (e.g., 118a and 118b).

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. Air mover 108 may include any mechanical or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal (e.g., a pulse-width modulation signal) communicated from air mover control system 114 of management controller 112. In operation, air mover 108 may cool information handling resources of information handling system 102 by drawing cool air into an enclosure housing the information handling resources from outside the chassis, expelling warm air from inside the enclosure to the outside of such enclosure, and/or moving air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include an air mover control system 114. Air mover control system 114 may include any system, device, or apparatus configured to receive one or more signals indicative of one or more temperatures within information handling system 102 (e.g., one or more signals from one or more temperature sensors 118), and based on such signals, calculate an air mover driving signal (e.g., a pulse-width modulation signal) to maintain an appropriate level of cooling, increase cooling, or decrease cooling, as appropriate, and communicate such air mover driving signal to air mover 108. In some embodiments, air mover control system 114 may include a program of instructions (e.g., software, firmware) configured to, when executed by a processor or controller integral to management controller 112, carry out the functionality of air mover control system 114. The functionality of air mover control system 114 is described in greater detail below with respect to FIG. 2.

A device 116 may comprise any suitable information handling resource communicatively coupled to processor 103.

A temperature sensor 118 may be any system, device, or apparatus (e.g., a thermometer, thermistor, etc.) configured to communicate a signal to air mover control system 114 indicative of a temperature within information handling system 102.

In addition to processor 103, memory 104, air mover 108, management controller 112, devices 116, and temperature sensors 118, information handling system 102 may include one or more other information handling resources. In addition, for the sake of clarity and exposition of the present disclosure, FIG. 1 depicts only one air mover 108, two devices 116, and two temperature sensors 118. In embodiments of the present disclosure, information handling system 102 may include any number of air movers 108, devices 116, and temperature sensors 118.

In operation, temperature sensor 118*a* may measure a first temperature proximate to device 116*a* and temperature sensor 118*b* may measure a second temperature proximate to device 116*b*. To properly maintain operating temperatures of devices 116 below respective maximum operating temperatures, air mover control system 114 may, for example: (i) compare the first temperature to a first setpoint temperature associated with device 116*a* to determine a first error; (ii) based on the first error, determine a first air mover speed sufficient to cool device 116*a*; (iii) compare the second temperature to a second setpoint temperature associated with device 116*b* to determine a second error; (iv) based on the second error, determine a second air mover speed sufficient to cool device 116*b*; and (v) apply the higher of the first air mover speed and the second air mover speed to control motor 110 of air mover 108. Although the foregoing description discusses selecting the higher of two air mover speeds, similar approaches may be applied to multiple air mover speeds determined from multiple temperature sensors.

To reduce polling by air mover control system 114 of a measured temperature from a temperature sensor 118, air mover control system 114 may be configured to determine for a particular device 116 whether an air mover speed of air mover 108 set by air mover control system 114 exceeds an open-loop air mover speed associated with the particular device, and if so, disable polling of the measured temperature from a temperature sensor associated with the particular device. This approach of dynamically enabling polling is set forth in more detail below with respect to FIG. 2.

FIG. 2 illustrates a flow chart of an example method 200 for dynamic enablement of polling of a measured temperature in an air mover control system, in accordance with the present disclosure. According to one embodiment, method 200 may begin at step 202. As noted above, teachings of the present disclosure may be implemented in a variety of configurations of information handling system 102 and/or air mover control system 114. As such, the preferred initialization point for method 200 and the order of the steps comprising method 200 may depend on the implementation chosen.

At step 202, air mover control system 114 may poll temperature sensor 118*a* for a first measured temperature associated with device 116*a* and receive such first measured temperature. At step 204, air mover control system 114 may compare the first temperature to a first maximum temperature associated with device 116*a* to determine a first air mover speed sufficient to cool device 116*a*.

At step 208, air mover control system 114 may determine if polling of temperature sensor 118*b* is enabled or disabled. If polling of temperature sensor 118*b* is enabled, method 200 may proceed to step 210. If polling of temperature sensor 118*b* is disabled, method 200 may proceed to step 218.

At step 210, air mover control system 114 may poll temperature sensor 118*b* for a second measured temperature associated with device 116*b* and receive such second measured temperature. At step 212, air mover control system 114 may compare the second temperature to a second maximum temperature associated with device 116*b* to determine a second air mover speed sufficient to cool device 116*b*. At step 216, air mover control system 114 may select the higher of the first air mover speed and the second air mover speed as the operating speed at which to operate air mover 108. After completion of step 216, method 200 may proceed to step 220.

At step 218, air mover control system 114 may select the first air mover speed as the operating speed at which to operate air mover 108.

At step 220, air mover control system 114 may control motor 110 of air mover 108 to operate at the selected operating speed.

At step 222, air mover control system 114 may determine if the operating speed is greater than an open-loop operating speed sufficient to maintain cooling of device 116*b* without regard to the second measured temperature associated with device 116*b*. If the operating speed is greater than the open-loop operating speed sufficient to maintain cooling of device 116*b* without regard to the second measured temperature, method 200 may proceed to step 224. Otherwise, if the operating speed is lesser than the open-loop operating speed, method 200 may proceed to step 226.

At step 224, air mover control system 114 may enable (or maintain enablement of) polling of temperature sensor 118*b*. After completion of step 224, method 200 may proceed again to step 202.

At step 226, air mover control system 114 may disable (or maintain disablement of) polling of temperature sensor 118*b*. After completion of step 226, method 200 may proceed again to step 202.

Although FIG. 2 discloses a particular number of steps to be taken with respect to method 200, method 200 may be executed with greater or lesser steps than those depicted in FIG. 2. In addition, although FIG. 2 discloses a certain order of steps to be taken with respect to method 200, the steps comprising method 200 may be completed in any suitable order.

Method 200 may be implemented using information handling system 102, air mover control system 114, or any other system operable to implement method 200. In certain embodiments, method 200 may be implemented partially or fully in software and/or firmware embodied in computer-readable media.

Although the foregoing discussion contemplates application systems and methods for closed-loop control to operation of an air mover, similar methods and systems may be generalized and applied to other closed-loop controls. For example, such similar methods and systems may be applied to generate a driving signal to any appropriate plant or component based on any measured process value other than a measured temperature and a setpoint value other than a setpoint temperature.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
    a controller configured to control a process value using closed-loop control, wherein:
       when using closed-loop control, the controller is configured to control the process value based on a measured process value indicative of the process value communicated from a sensor and by generating a driving signal that is a maximum of a first driving signal which is a function of the measured process value and a second driving signal; and
       the controller is configured to disable polling by a controller of the sensor for the measured process value when the driving signal is greater than a threshold open-loop driving signal sufficient to maintain the process value within a desired range of the process value in the absence of closed-loop control.

2. The system of claim 1, wherein the process value comprises a temperature.

3. The system of claim 1, wherein the measured process value comprises a measured temperature measured by the sensor.

4. The system of claim 1, wherein the driving signal comprises a signal for controlling a speed of an air mover.

5. The system of claim 1, wherein the second driving signal is a driving signal sufficient to maintain a second process value within a desired range of the second process value.

6. The system of claim 5, wherein the second driving signal is based on a second measured process value indicative of the second process value communicated from a second sensor.

7. The system of claim 6, wherein:
    the process value is a first temperature associated with a first device;
    the second process value is a second temperature associated with a second device; and
    the driving signal comprises a signal for controlling a speed of an air mover for cooling the first device and the second device.

8. A method comprising:
    using closed-loop control by controlling a process value based on a measured process value indicative of the process value communicated from a sensor and by generating a driving signal that is a maximum of a first driving signal which is a function of the measured process value and a second driving signal; and
    disabling polling of the sensor for the measured process value when the driving signal is greater than a threshold open-loop driving signal sufficient to maintain the process value within a desired range of the process value in the absence of closed-loop control.

9. The method of claim 8, wherein the process value comprises a temperature.

10. The method of claim 8, wherein the measured process value comprises a measured temperature measured by the sensor.

11. The method of claim 8, wherein the driving signal comprises a signal for controlling a speed of an air mover.

12. The method of claim 8, wherein the second driving signal is a driving signal sufficient to maintain a second process value within a desired range of the second process value.

13. The method of claim 12, wherein the second driving signal is based on a second measured process value indicative of the second process value communicated from a second sensor.

14. The method of claim 13, wherein:
    the process value is a first temperature associated with a first device;
    the second process value is a second temperature associated with a second device; and
    the driving signal comprises a signal for controlling a speed of an air mover for cooling the first device and the second device.

15. An article of manufacture comprising:
    a non-transitory computer-readable medium; and
    computer-executable instructions carried on the computer-readable medium, the instructions readable by a processor, the instructions, when read and executed, for causing the processor to:

operate a process using closed-loop control by controlling a process value based on a measured process value indicative of the process value communicated from a sensor and by generating a driving signal that is a maximum of a first driving signal which is a function of the measured process value and a second driving signal; and disable polling by a controller of the sensor for the measured process value when the driving signal is greater than a threshold open-loop driving signal sufficient to maintain the process value within a desired range of the process value in the absence of closed-loop control.

16. The article of claim 15, wherein the process value comprises a temperature.

17. The article of claim 15, wherein the measured process value comprises a measured temperature measured by the sensor.

18. The article of claim 15, wherein the driving signal comprises a signal for controlling a speed of an air mover.

19. The article of claim 15, wherein the second driving signal is a driving signal sufficient to maintain a second process value within a desired range of the second process value.

20. The article of claim 19, wherein the second driving signal is based on a second measured process value indicative of the second process value communicated from a second sensor.

21. The article of claim 20, wherein:
the process value is a first temperature associated with a first device;
the second process value is a second temperature associated with a second device; and
the driving signal comprises a signal for controlling a speed of an air mover for cooling the first device and the second device.

* * * * *